(12) United States Patent
Lee

(10) Patent No.: US 9,591,754 B2
(45) Date of Patent: Mar. 7, 2017

(54) ARRAY SUBSTRATE AND METHOD OF MOUNTING INTEGRATED CIRCUIT USING THE SAME

(71) Applicant: Samsung Display Co., Ltd., Yongin (KR)

(72) Inventor: Dae Geun Lee, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 18 days.

(21) Appl. No.: 14/526,182

(22) Filed: Oct. 28, 2014

(65) Prior Publication Data

US 2015/0366049 A1 Dec. 17, 2015

(30) Foreign Application Priority Data

Jun. 17, 2014 (KR) .................. 10-2014-0073756

(51) Int. Cl.
*H01L 23/48* (2006.01)
*H05K 1/11* (2006.01)
*G02F 1/1345* (2006.01)
*H05K 1/18* (2006.01)

(52) U.S. Cl.
CPC .......... *H05K 1/111* (2013.01); *G02F 1/13458* (2013.01); *H05K 1/189* (2013.01); *H05K 2201/09381* (2013.01); *H05K 2201/09418* (2013.01); *H05K 2201/09427* (2013.01); *H05K 2201/09709* (2013.01); *H05K 2201/09954* (2013.01); *H05K 2201/10128* (2013.01); *H05K 2203/166* (2013.01); *Y02P 70/611* (2015.11); *Y10T 29/49005* (2015.01)

(58) Field of Classification Search
CPC .......... H05K 2201/09427; H05K 2201/09418; H05K 2201/09381; H05K 2201/09954; H05K 2201/10128; H05K 1/111; H05K 1/189; G02F 1/13458
See application file for complete search history.

(56) References Cited

U.S. PATENT DOCUMENTS

2003/0160929 A1 8/2003 Kurasawa
2014/0321088 A1 10/2014 Bae et al.

FOREIGN PATENT DOCUMENTS

| EP | 2811337 | 12/2014 |
|---|---|---|
| JP | H04-352132 | 12/1992 |
| JP | 2000-187452 | 7/2000 |
| JP | 2007-242942 | 9/2007 |
| JP | 2012-058533 | 3/2012 |
| KR | 10-2007-0007633 | 1/2007 |
| KR | 10-2008-0086214 | 9/2008 |
| KR | 10-2011-0119004 | 11/2011 |
| KR | 10-2013-0053280 | 5/2013 |

OTHER PUBLICATIONS

Extended European Search Report, issued Oct. 7, 2015, in European Patent Application No. 15152709.0.

*Primary Examiner* — Hoa B Trinh
(74) *Attorney, Agent, or Firm* — H.C. Park & Associates, PLC

(57) ABSTRACT

An array substrate including a display area and a non-display area surrounding the display area. The non-display area includes a pad portion including one or more first pads that each have a parallelogram shape.

13 Claims, 12 Drawing Sheets

ARRAY SUBSTRATE AND METHOD OF MOUNTING INTEGRATED CIRCUIT USING THE SAME

CROSS-REFERENCE TO RELATED APPLICATION

This application claims priority from Korean Patent Application No. 10-2014-0073756, filed on Jun. 17, 2014, which is hereby incorporated by reference for all purposes as if fully set forth herein.

BACKGROUND

Field

Exemplary embodiments relate to a method of mounting an integrated circuit using an array substrate.

Discussion of the Background

A display device, such as a liquid crystal display (LCD) device or an organic light-emitting diode (OLED) device, may include an array substrate, which has a display area and a non-display area surrounding the display area. The array substrate may be used as a circuit board for separately driving pixels of the display device. Gate wiring for transmitting a scan signal, data wiring for transmitting an image signal, thin-film transistors (TFTs), and various organic or inorganic insulating layers may be provided on the array substrate. Each of the TFTs include a gate electrode that forms part of the gate wiring, a semiconductor layer that forms a channel with the gate electrode, and a source electrode and a drain electrode that form parts of the data wiring. The TFT may function as a switching device.

In the non-display area, which surrounds the display area, wires may be provided. The wires may be connected to gate lines or data lines in the display area. The wires may extend in various shapes, and may also be connected to pads in a pad unit below the array substrate. In the pad unit, a driving integrated circuit may be provided. The driving integrated circuit may apply driving signals to the gate lines and the data lines. The driving integrated circuit may include a plurality of bumps, which are aligned with, and provide driving signals to, the pads, respectively, of the pad unit.

The array substrate may be formed of a flexible material, such as polyimide, in accordance with recent trends in manufacturing flexible displays. However, the size of a flexible array substrate may change during processes, which are then followed by the formation of a pad unit, thereby causing misalignment between the bumps of a driving integrated circuit and the pads of the pad unit.

The above information disclosed in this Background section is only for enhancement of understanding of the background of the inventive concept and, therefore, it may contain information that does not form the prior art that is already known in this country to a person of ordinary skill in the art.

SUMMARY

Exemplary embodiments provide an array substrate capable of preventing misalignment between the bumps of a driving integrated circuit and the pads of a pad unit regardless of a change in the size of a flexible array substrate.

Exemplary embodiments also provide a method of mounting an integrated circuit, which is capable of preventing misalignment between the bumps of a driving integrated circuit and the pads of a pad unit regardless of a change in the size of a flexible array substrate.

Additional aspects will be set forth in the detailed description which follows, and, in part, will be apparent from the disclosure, or may be learned by practice of the inventive concept.

An exemplary embodiment discloses an array substrate, including a display area and a non-display area configured to surround the display area, wherein the non-display area includes a pad portion, and the pad portion includes one or more first pads, which are formed as parallelograms.

An exemplary embodiment also discloses an array substrate, including a display area; and a non-display area configured to surround the display area, wherein the non-display area includes a pad portion, and the pad portion includes a first sub-pad unit and a second sub-pad unit that differ from each other in terms of the distance between either end thereof and an imaginary line that divides the pad portion in half.

An exemplary embodiment also discloses a method of mounting an integrated circuit, the method including aligning a pad portion of an array substrate with a plurality of bumps of an integrated circuit; calculating a misalignment value that indicates a degree of misalignment between the pad portion and the bumps in a first direction; and moving the integrated circuit in a second direction that is perpendicular to the first direction, according to the misalignment value.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
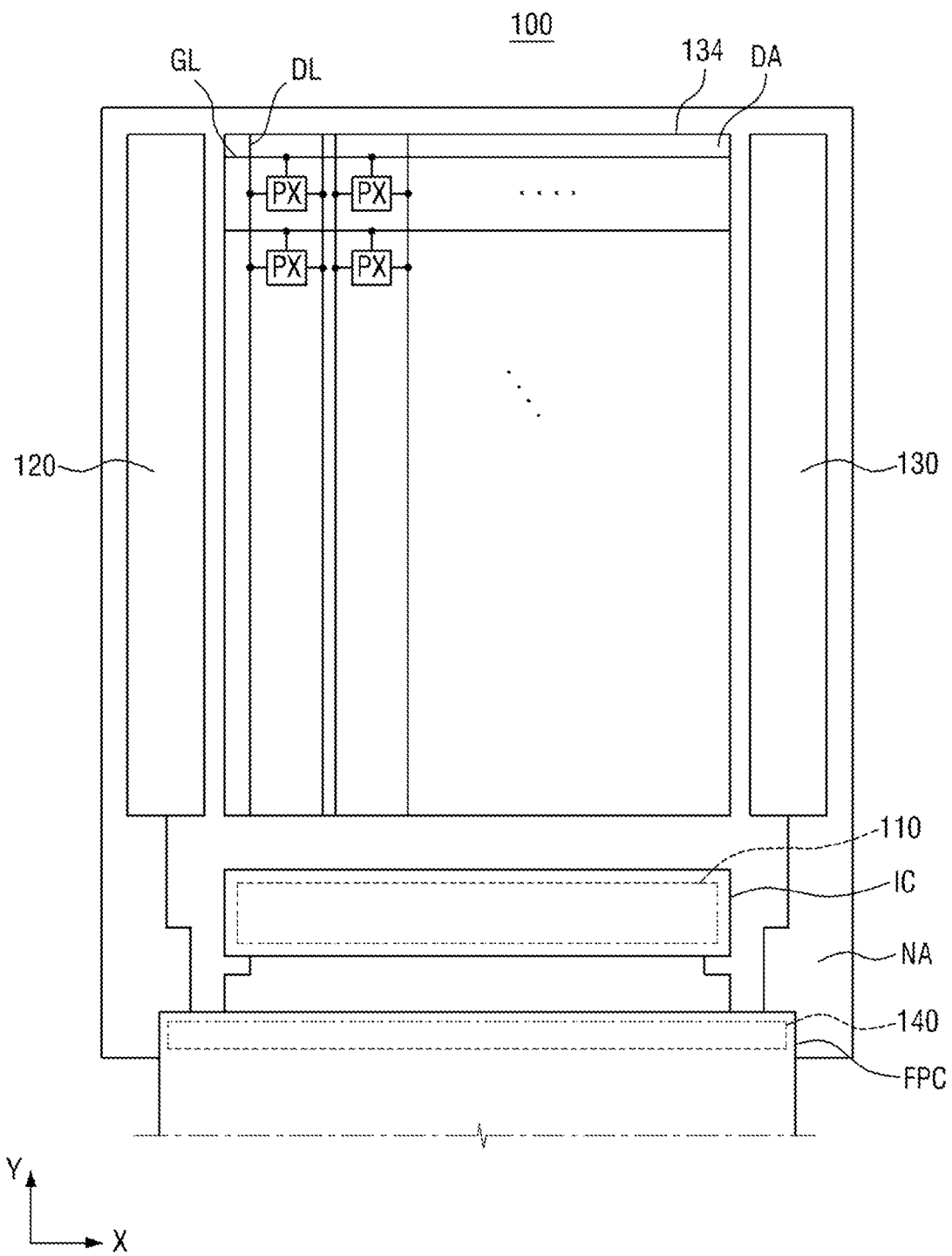
FIG. 1 is a plan view of an array substrate according to an exemplary embodiment.
Figure 2:
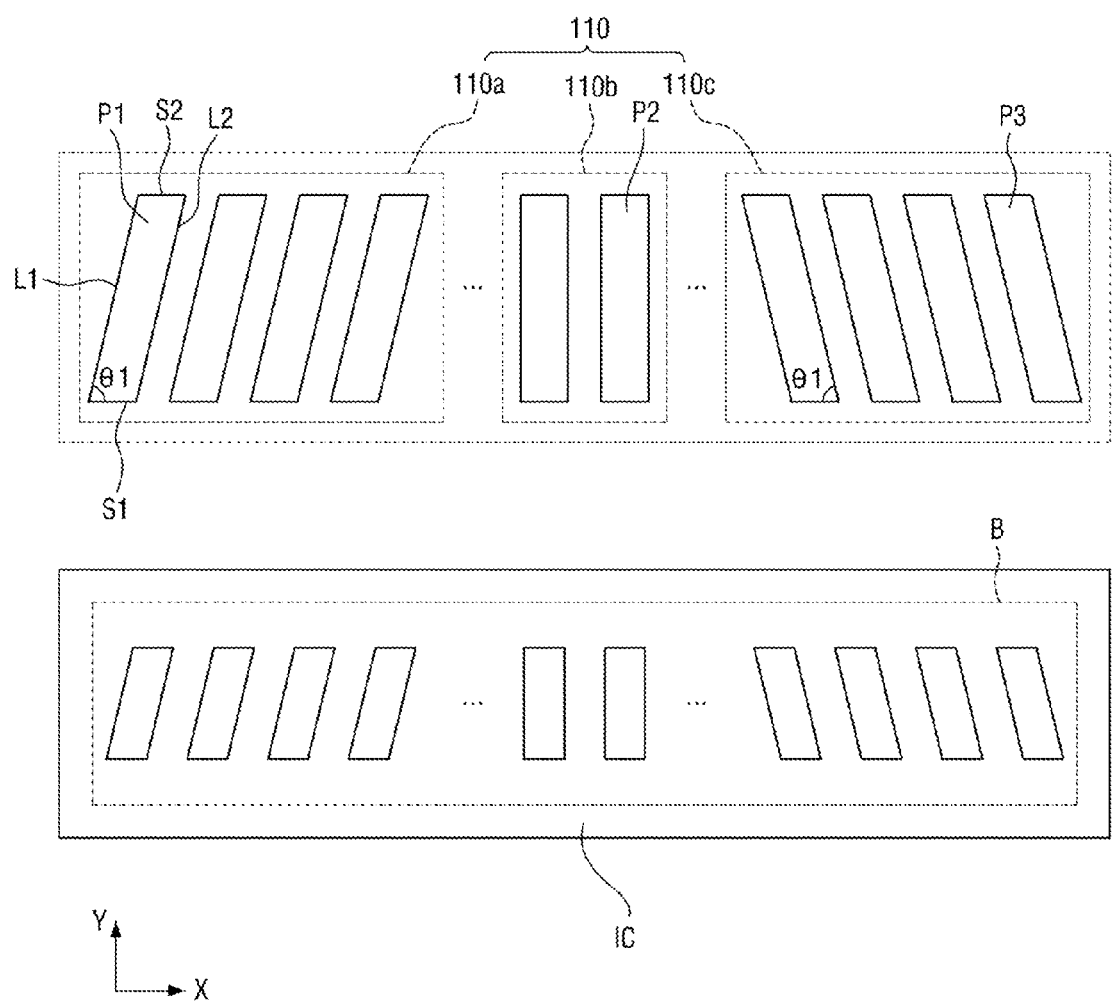
FIG. 2 is a plan view illustrating a pad portion and a data driving integrated circuit, according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Referring to FIG. 1, an array substrate 100 includes a display area DA and a non-display area NA.

The display area DA may be a region where an image is displayed. The display area DA may include pixels PX arranged in a matrix. Each of the pixels PX may be provided with a display element displaying an image, and a thin-film transistor (TFT) electrically connected to the display element. The display element may be an organic light-emitting diode (OLED), for example. The pixels PX may be defined by gate lines GL and data lines DL intersecting the gate lines GL. The gate lines GL may extend in a first direction X, and the data lines DL may extend in a second direction Y intersecting the first direction X. The first direction X may correspond to a direction of rows of the pixels PX, and the second direction Y may correspond to a direction of columns of the pixels PX.

The non-display area NA may be a region where no image is displayed, and may surround the display area DA. The non-display area NA may also be a region adjoining, or provided along, the edges of the array substrate 100. In the non-display area NA, a pad portion 110, a gate driving unit 120, and a power supply unit 130 may be provided.

The pad portion 110 may be a region where a data driving integrated circuit IC, which applies a data signal voltage to the data lines DL, is mounted. The data driving integrated circuit IC may be Chip-on-Glass (COG)-mounted on the pad portion 110 on the array substrate 100. That is, the pad portion 110 may be a COG pad unit. Alternatively, in response to the array substrate 100 being formed of a flexible material, the pad portion 110 may be a Chip-on-Plastic (COP) pad unit.

The gate driving unit 120 may be provided on a side of the array substrate 100 perpendicular to the side where the data driving integrated circuit IC is provided. The gate driving unit 120 may provide a gate signal voltage to the gate lines GL, and may sequentially scan the pixels PX. The power supply unit 130 may be provided on side of the array substrate 100 opposite to the side where the gate driving unit 120 is provided. The power supply unit 130 may provide a power voltage necessary for driving the pixels PX.

The pad portion 110 may include a plurality of pads arranged in one direction. The data driving integrated circuit IC may include a plurality of bumps B corresponding to the pads, respectively, of the pad portion 110. That is, the bumps B of the data driving integrated circuit IC may be connected one-on-one to the pads of the pad portion 110. The relationship between the pads of the pad portion 110 and the bumps B of the data driving integrated circuit IC will hereinafter be described with reference to FIGS. 2 to 7.

Referring to FIGS. 2 to 7, the pad portion 110 may include a plurality of pads. The pads may be arranged in the first direction X. The pad portion 110 may be divided into a first sub-pad unit 110*a*, a second sub-pad unit 110*b*, and a third sub-pad unit 110*c*.

The first sub-pad unit 110*a* may be provided on one side of the pad portion 110, the second sub-pad unit 110*b* may be provided in the middle of the pad portion 110, and the third sub-pad unit 110*c* may be provided on the other side of the pad portion 110. That is, the first sub-pad unit 110a and the third sub-pad unit 110c may be arranged symmetrically with respect to the second sub-pad unit 110b. The first sub-pad unit 110a and the third sub-pad unit 110c may have a "mirror pair" relationship, and may have the same structure.

The first sub-pad unit 110a may include one or more first pads P1, which are formed as parallelograms having a first inclination angle θ1. Each of the first pads P1 may have a first short side S1 extending in the first direction X, a second short side S2 parallel to the first short side S1, a first long side L1 forming the first inclination angle θ1 with the first short side S1, and a second long side L2 parallel to the first long side L1. That is, the first long side L1 may extend diagonally from one end of the first short side S1 at the first inclination angle θ1 and meet one end of the second short side S2, the second long side L2 may extend diagonally from the other end of the first short side S1 at the first inclination angle θ1 and meet the other end of the second short side S2. For example, each of the first pads P1 may be inclined from the first short side S1 thereof in a direction of the sum of a positive first direction +X and a positive second direction +Y. In an alternative exemplary embodiment, each of the first pads P1 may be inclined from the first short side S1 thereof in a direction of the sum of a negative first direction −X and the positive second direction +Y. The first inclination angle θ1 may be appropriately determined in consideration of the distance between the pad portion 110 and the display area DA, and is not necessarily limited to a certain angle or a certain range of angles. The first inclination angle θ1 may represent an angle between a lengthwise direction of the first pads P1 (a direction parallel to the long sides L1, L2) and a lengthwise direction of pad portion 110. In other words, first inclination angle θ1 may be equal to the acute internal angles of the respective first pads P1.

The second sub-pad unit 110b may include one or more second pads P2, which are formed as rectangles. That is, the second sub-pad unit 110b may include one or more second pads P2, which are not inclined and have a pair of parallel short sides and a pair of parallel long sides perpendicular to the pair of parallel short sides.

The third sub-pad unit 110c may be arranged symmetrically with the first sub-pad unit 110a with respect to the second sub-pad unit 110b. That is, the third sub-pad unit 110c may include one or more third pads P3 which are inclined from a first short side S1 thereof in a direction of the sum of the negative first direction −X and the positive second direction +Y. The first pads P1 and the third pads P3 may be inclined from the bottom to the top thereof, toward the second sub-pad unit 110b, along the second direction Y. That is, the pad portion 110 may include the second pads P2, which are provided in the middle of the pad portion 110 and are formed as rectangles that are not inclined, the first pads P1, which are provided on one side of the pad portion 110 and are formed as parallelograms that are inclined from the bottom to the top thereof toward the second pads P2, and the third pads P3, which are provided on the other side of the pad portion 110 and are formed as parallelograms that are also inclined from the bottom to the top thereof toward the second pads P2.

The data driving integrated circuit IC may include a plurality of bumps B. The bumps B may be formed to conform to the shape of the pad portion 110. More specifically, the bumps B may include one or more rectangular bumps B that are not inclined in the middle of the data driving integrated circuit IC, and one or more rectangular bumps B that are provided on one side of the data driving integrated circuit IC and are inclined from the bottom to the top thereof toward the rectangular bumps B, and one or more rectangular bumps B that are provided on the other side of the data driving integrated circuit IC and are also inclined from the bottom to the top thereof toward the rectangular bumps B.

Figure 3:
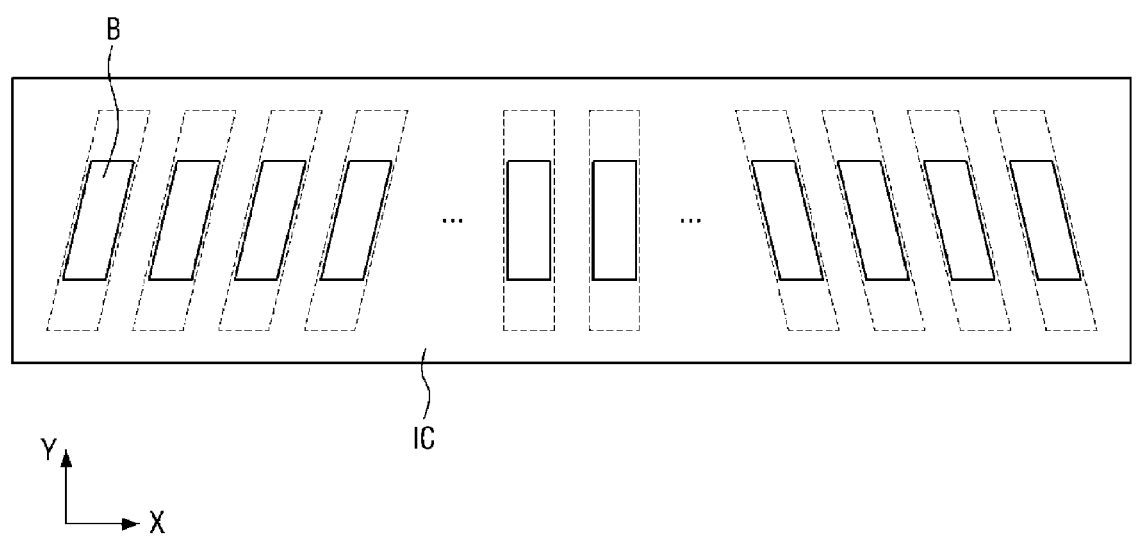
FIG. 3 is a plan view illustrating a data driving integrated circuit properly mounted on a pad portion.

The bumps B of the data driving integrated circuit IC may be connected to the pads, respectively, of the pad portion 110. More specifically, the bumps B of the data driving integrated circuit IC may be coupled to the pads of the pad portion 110 via an anisotropic conductive film (ACF), and thus, may be able to exchange electrical signals with each other. As illustrated in FIG. 3, in a case in which the array substrate 100 being properly fabricated as designed, the bumps B of the data driving integrated circuit IC may one-on-one correspond to the pads of the pad portion 110, and the data driving integrated circuit IC may be properly mounted on the array substrate 100. To facilitate connecting the pads of the pad portion 110 and the bumps B of the data driving integrated circuit IC, the pads of the pad portion 110 may be formed to have longer short sides and longer long sides than the bumps B of the data driving integrated circuit IC. That is, the size of the pads of the pad portion 110 may be larger than the size of the bumps B of the data driving integrated circuit IC. The pads of the pad portion 110 may be formed to have longer sides than the bumps B of the data driving integrated circuit IC to ensure the movement of the data driving integrated circuit IC in the second direction Y. The pads of the pad portion 110 may be formed to have sides that are 1.5 to 2 times longer than the bumps B of the data driving integrated circuit IC, for example.

In a case in which the array substrate 100 is formed of a flexible material, the array substrate 100 may expand or contract, especially during processes followed by the formation of the pad portion 110. The array substrate 100 may contract or expand in the first direction X and/or the second direction Y.

Figure 4:
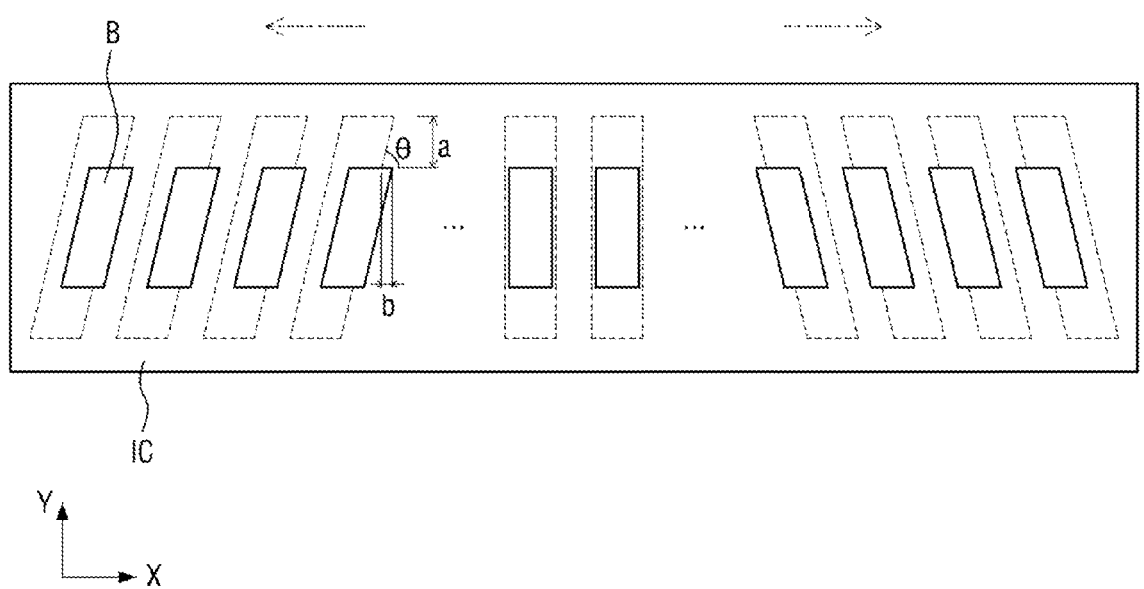
FIGS. 4, 5, 6, and 7 are plan views illustrating the deformation of a pad portion in accordance with expansion or contraction of an array substrate and the resulting movement of bumps of a data driving integrated circuit.
Figure 6:
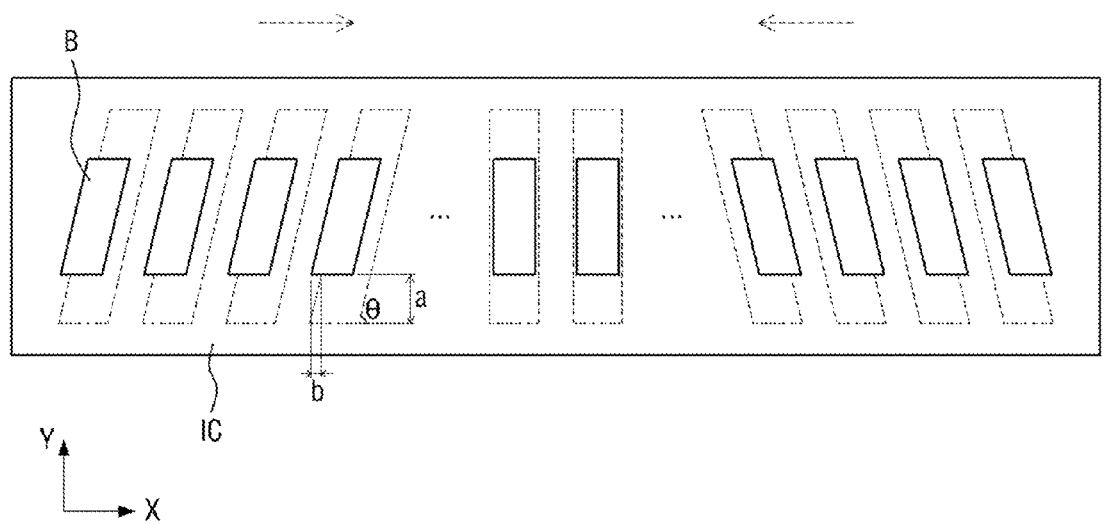
Figure 7:
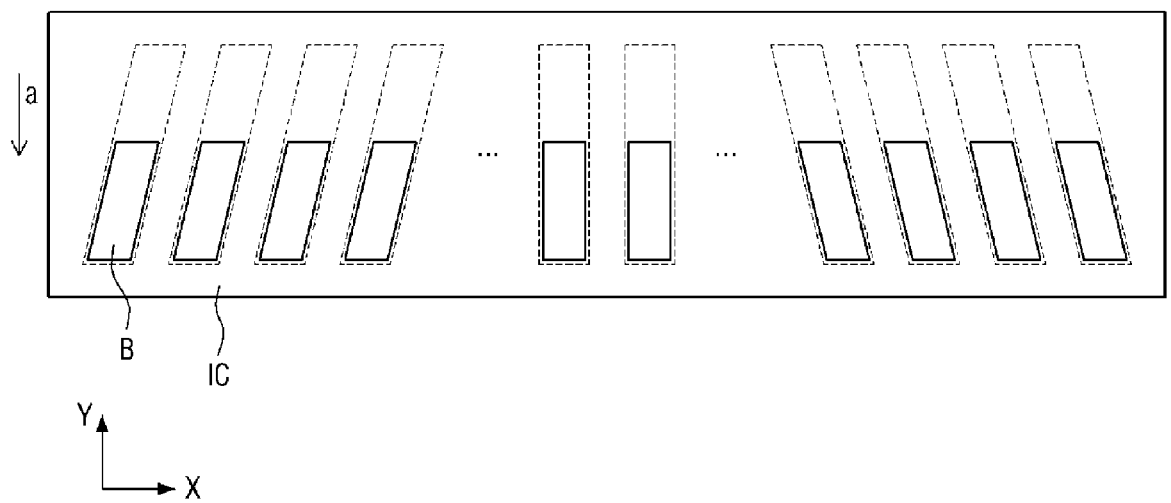

More specifically, the array substrate 100 may expand in the first direction X, as illustrated in FIG. 4, and may contract in the first direction X, as illustrated in FIG. 6. The expansion or contraction of the array substrate 100 in the first direction X may occur mostly at the sides of the array substrate 100, and may considerably affect the first sub-pad unit 110a and the third sub-pad unit 110c. That is, in response to the array substrate 100 expanding or contracting, the first sub-pad unit 110a and the third sub-pad unit 110c may be positioned more outwardly or inwardly than they are designed to be. As a result of the displacement of the first sub-pad unit 110a and the third sub-pad unit 110c, the pads of the pad portion 110 may be misaligned with the bumps B of the data driving integrated circuit IC.

Figure 5:
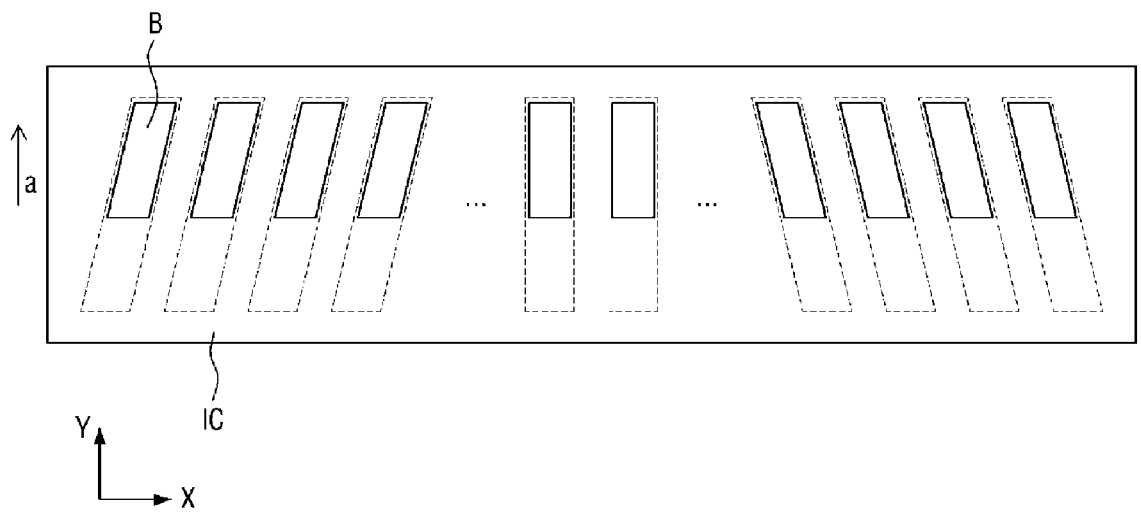

However, because the pad portion 110 and the data driving integrated circuit IC include pads or bumps B that are formed as parallelograms with a predetermined inclination angle, the pad portion 110 and the data driving integrated circuit IC may flexibly respond to the deformation of the array substrate 100. In response to the array substrate 100 expanding, as illustrated in FIG. 4, the bumps B of the data driving integrated circuit IC may be aligned with the pads of the pad portion 110, which is deformed as a result of the expansion of the array substrate 100, by moving the data driving integrated circuit IC toward the positive second direction +Y by a distance a, as illustrated in FIG. 5. As a result, the data driving integrated circuit IC may be aligned with the pad portion 110, and may be properly mounted on the array substrate 100. On the other hand, in response to the array substrate 100 contracting, the bumps B of the data driving integrated circuit IC may be aligned with the pads of the pad portion 110, which are deformed as a result of the contraction of the array substrate 100, by moving the data driving integrated circuit IC toward a negative second direction +Y by the distance a, as illustrated in FIG. 6. As a result, the data driving integrated circuit IC may be aligned with the pad portion 110, and may be properly mounted on the array substrate 100.

The distance a by which the data driving integrated circuit IC is moved in the second direction Y to be aligned with the pad portion 110 may be calculated by using Equation (1):

$$a = b \tan \theta \tag{1}$$

Even if the pad portion 110 is deformed as a result of the contraction or expansion of the array substrate 100, the data driving integrated circuit IC may be aligned again with the pad portion 110 by moving the data driving integrated circuit IC toward the positive or negative second direction +Y or −Y. Accordingly, the efficiency of mounting the data driving integrated circuit IC may be improved.

Referring back to FIG. 1, the array substrate 100 may also include a second pad unit 140, which is provided for coupling the array substrate 100 to a flexible printed circuit board (FPCB). The second pad unit 140 may be a Flex-on-Glass (FOG) pad unit. The FPCB may serve as a bridge between a host (not illustrated) and the array substrate 100 for transmitting various signals for driving the array substrate 100 to the array substrate 100. The FPCB may include a plurality of bumps B for being connected to the second pad unit 140, and the bumps B of the FPCB may be electrically connected to a plurality of pads, respectively, of the second pad unit 140 via an ACF. Accordingly, the FPCB may electrically exchange signals with the second pad unit 140 via the bumps B thereof and the pads of the second pad unit 140.

The second pad unit 140 may be provided along an edge of the array substrate 100, and may be closer than the pad portion 140 to the edge of the array substrate 100. The second pad unit 140 may be electrically connected to, and transmit signals to, the pad portion 110, the gate driving unit 120, and the power supply unit 130 via wiring.

The second pad unit 140, like the pad portion 110, may be affected by the deformation of the array substrate 120 and, as a result, the arrangement of the pads in the second pad unit 140, especially those on either side of the second pad unit 140, may be changed. However, the second pad unit 140 has substantially the same structure as the pad portion 110, and may, thus, flexibly respond to the deformation of the array substrate 100, similar to the pad portion 110. More specifically, the pads on either side of the second pad unit 140 may be formed as parallelograms with a predetermined inclination angle, and any misalignment between the FPCB and the second pad unit 140 may be corrected by moving the FPCB in the second direction Y, i.e., may divide the pad portion 210 widthwise.

Pad portions according to another exemplary embodiment will hereinafter be described in detail with reference to FIG. 8, focusing mainly on differences with the previous exemplary embodiment. In FIGS. 1 to 13, like reference numerals indicate like elements, and thus, detailed descriptions thereof will be omitted.

Figure 8:
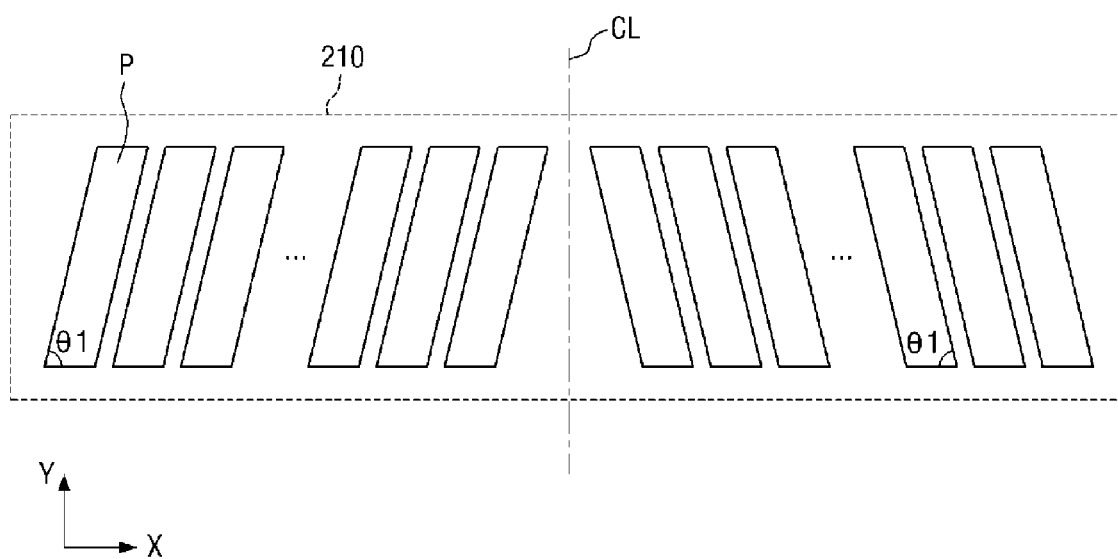
FIG. 8 is a plan view of a pad portion according to another exemplary embodiment.

Referring to FIG. 8, a pad portion 210 may include one or more first pads P, which are formed as parallelograms. Two or more first pads P may be provided, and may be arranged in a first direction X. The first pads P may be arranged symmetrically with respect to an imaginary line CL that divides the pad portion 210 in half. The imaginary line CL may extend parallel to a second direction Y.

In this exemplary embodiment, unlike in the exemplary embodiment of FIGS. 1 to 7, the first pads P, which are formed as parallelograms, are provided not only on either side of the pad portion 210, but also in the middle of the pad portion 210. The expansion or contraction of an array substrate may affect the arrangement of the pads in the pad portion 210 (especially those in the middle of the pad portion 210), but the pad portion 210 may effectively deal with the deformation of the array substrate.

Figure 9:
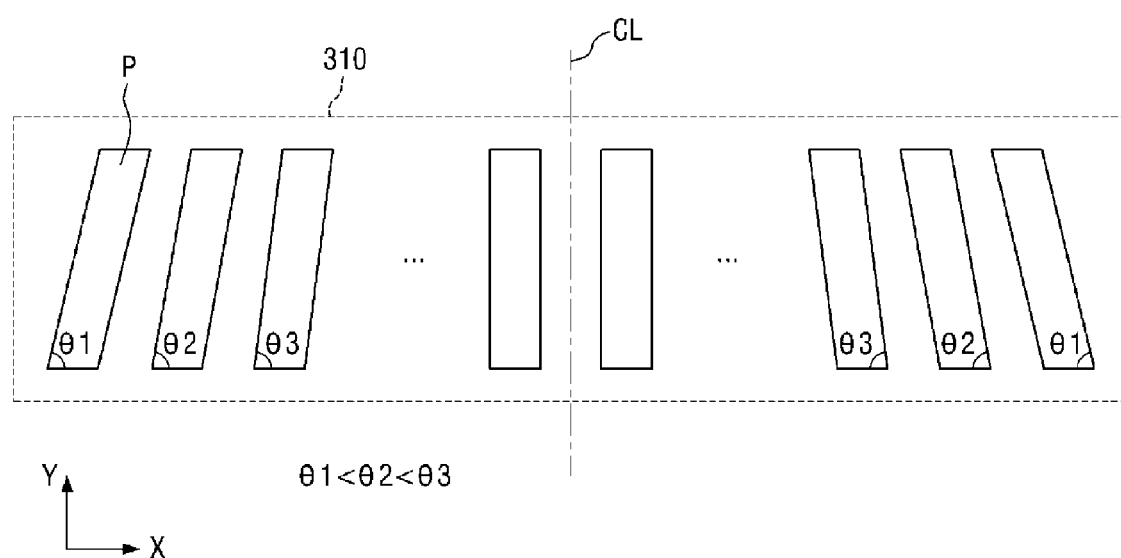
FIG. 9 is a plan view of a pad portion according to another exemplary embodiment.

FIG. 9 is a plan view of a pad portion according to another exemplary embodiment and will hereinafter be described, focusing mainly on differences with the previous exemplary embodiments of the invention.

Referring to FIG. 9, a pad portion 310 may include one or more first pads P, which are formed as parallelograms. Two or more first pads P may be provided, and may be arranged in a first direction X. The first pads P may be arranged symmetrically with respect to an imaginary line CL that divides the pad portion 210 in half. The imaginary line CL may extend parallel to a second direction Y, i.e., may divide the pad portion 210 widthwise.

The first pads P may have different inclination angles from one another. More specifically, the inclination angle of the first pads P may become greater the closer the first pads P are to the imaginary line CL. An inclination angle θ1 of first pads P at either end of the pad portion 310 may be less than an inclination angle θ2 of first pads P respectively next to the first pads P at either end of the pad portion 310. First pads P closest to the imaginary line CL may have an inclination angle of about 90 degrees.

The degree of the deformation of an array substrate may vary (or increase) from the center to the sides of the array substrate. The pad portion 310 may effectively deal with the deformation of the array substrate.

Figure 10:
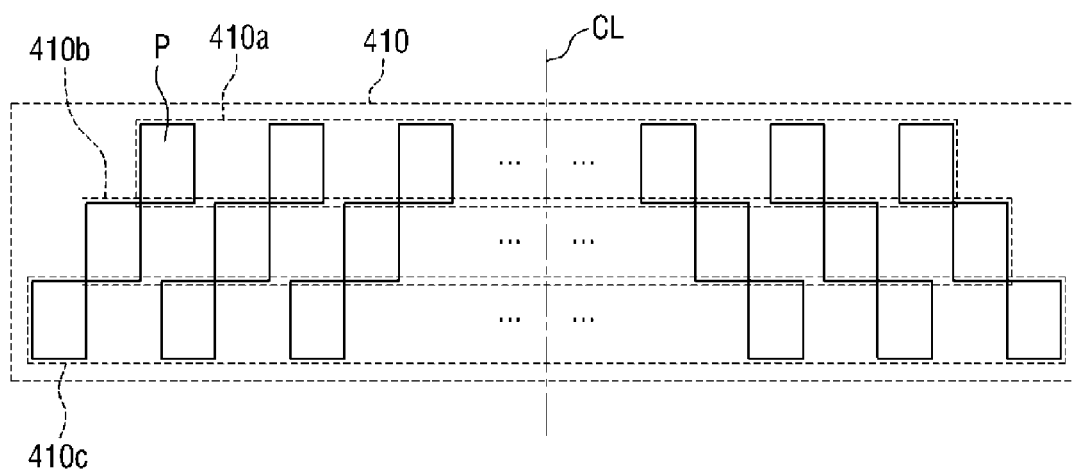
FIGS. 10, 11, and 12 are plan views of a pad portion according to another exemplary embodiment.
Figure 10:
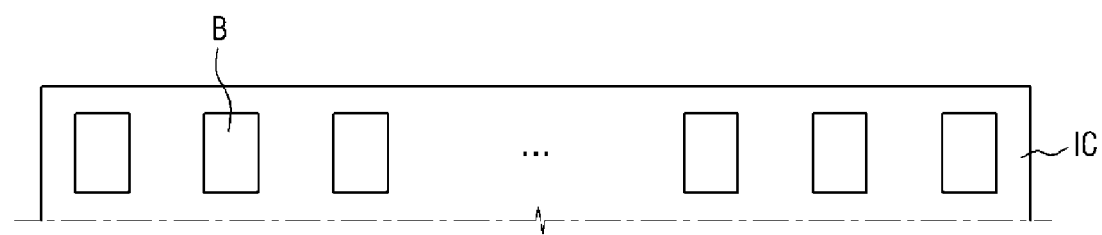
Figure 10:
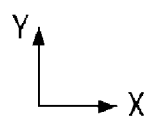
Figure 11:
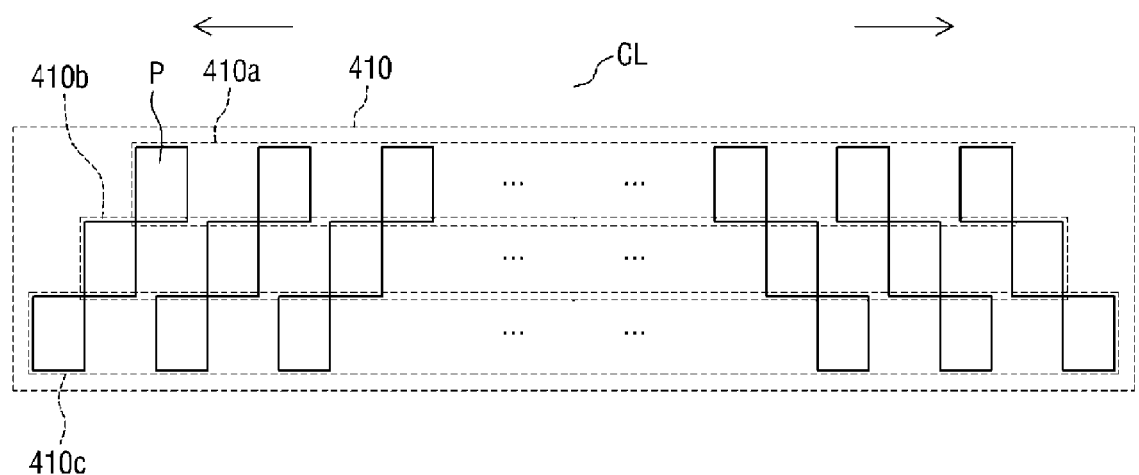
Figure 11:
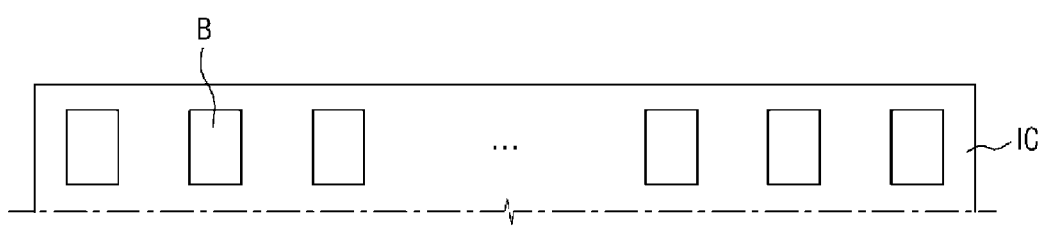
Figure 11:
Figure 12:
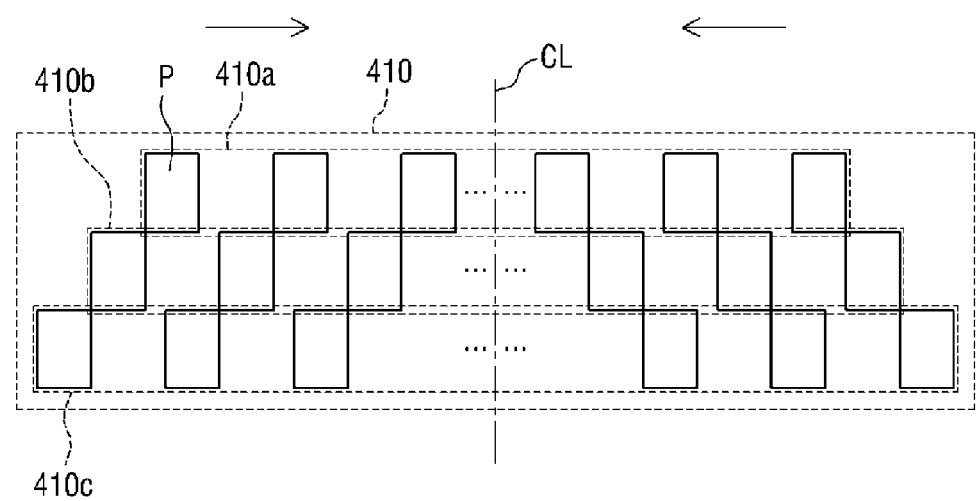
Figure 12:
Figure 12:
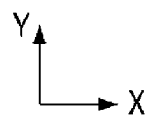

Referring to FIGS. 10 to 12 illustrating another exemplary embodiment, a pad portion 410 may be provided in a non-display area NA of an array substrate, and may be a region where a data driving integrated circuit IC is mounted. The data driving integrated circuit IC may include a plurality of bumps B, and the bumps B may be aligned with, and coupled to, a plurality of pads P, respectively, of the pad portion 410.

The pad portion 410 may include a first sub-pad unit 410a, a second sub-pad unit 410b, and a third sub-pad unit 410c. The first sub-pad unit 410a, the second sub-pad unit 410b, and the third sub-pad unit 410c may be arranged in a second direction Y. Each of the first sub-pad unit 410a, the second sub-pad unit 410b, and the third sub-pad unit 410c may include a plurality of pads P that are arranged in the first direction X. The pads P of each of the first sub-pad unit 410a, the second sub-pad unit 410b, and the third sub-pad unit 410c may be arranged symmetrically with respect to an imaginary line CL that divides the pad portion 410 in half. The data driving integrated circuit IC may be connected to one of the first sub-pad unit 410a, the second sub-pad unit 410b, and the third sub-pad unit 410c. In an example, the bumps B may be aligned with, and connected to, the first sub-pad unit 410a, but not to the second sub-pad unit 410b and the third sub-pad unit 410c. In this exemplary embodiment, the data driving integrated circuit IC may provide a data voltage signal to a display area DA via the first sub-pad unit 410a.

The first sub-pad unit 410a, the second sub-pad unit 410b, and the third sub-pad unit 410c may differ from one another in terms of the distance between an end thereof and the imaginary line CL. The imaginary line CL may be a line extending in the second direction Y through the center of the pad portion 410. Either end of the first sub-pad unit 410a may be closest to the imaginary line CL, either end of the third sub-pad unit 410c may be furthest apart from the imaginary line CL, and either end of the second sub-pad unit 410 may be more apart than the first sub-pad unit 410a, and less apart than the third sub-pad unit 410c, from the imaginary line CL.

As illustrated in FIG. 10, the arrangement of pads P in the second sub-pad unit 410b may coincide with the arrangement of the bumps B of the data driving integrated circuit IC. That is, in response to the array substrate where the pad portion 410 is not being deformed, the bumps B of the data driving integrated circuit IC may be mounted on the second sub-pad unit 410b by being aligned with the pads P, respectively, of the second sub-pad unit 410b.

However, as illustrated in FIG. 11, in response to expansion of the array substrate, the first sub-pad unit 410a, the second sub-pad unit 410b, and the third sub-pad unit 410c may expand in a direction toward the outside of the array substrate. As a result, the arrangement of the pads P in the second sub-pad unit 410b may no longer coincide with the arrangement of the bumps B of the data driving integrated circuit IC. However, the arrangement of pads P in the first sub-pad unit 410a may now coincide with the arrangement of the bumps B of the data driving integrated circuit IC. Thus, the data driving integrated circuit IC may be properly mounted on the first sub-pad unit 410a, instead of on the second sub-pad unit 410b.

On the other hand, as illustrated in FIG. 12, in response to contraction of the array substrate, the first sub-pad unit 410a, the second sub-pad unit 410b, and the third sub-pad unit 410c may contract in a direction toward the inside of the array substrate. As a result, the arrangement of the pads P in the second sub-pad unit 410b may no longer coincide with the arrangement of the bumps B of the data driving integrated circuit IC. However, the arrangement of pads P in the third sub-pad unit 410c may now coincide with the arrangement of the bumps B of the data driving integrated circuit IC. Thus, the data driving integrated circuit IC may be properly mounted on the third sub-pad unit 410c, instead of on the second sub-pad unit 410b.

According to this exemplary embodiment, the pad portion 410 includes a plurality of sub-pad units available for application to a driving integrated circuit and thus, may improve the efficiency of mounting a driving integrated circuit regardless of the expansion or contraction of an array substrate.

Figure 13:
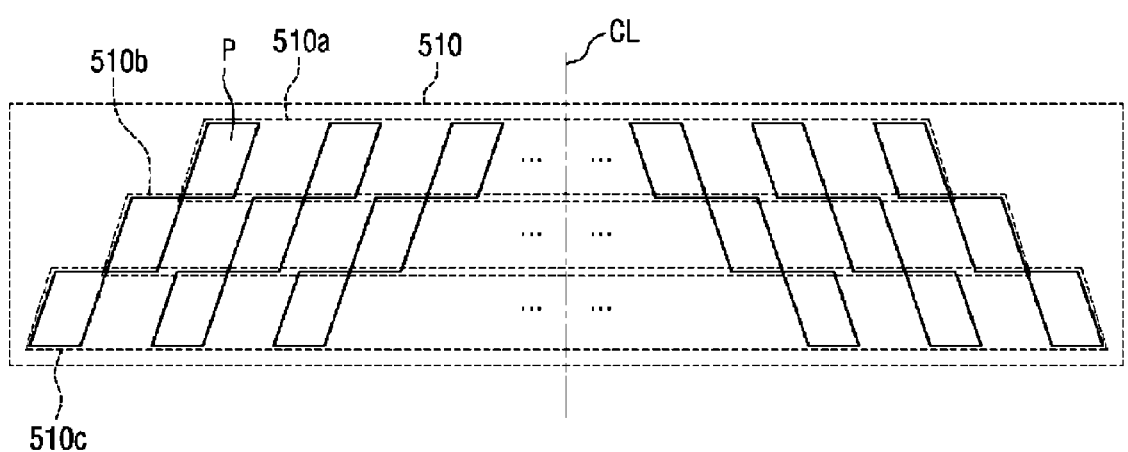
FIG. 13 is a plan view of a pad portion according to another exemplary embodiment.
Figure 13:
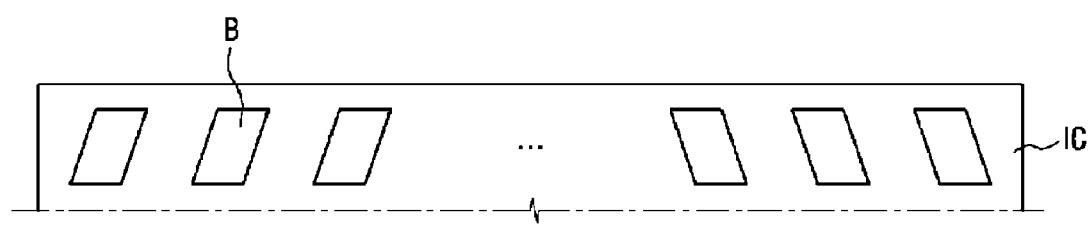
Figure 13:
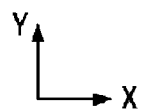

FIG. 13 is a plan view of a pad portion according to another exemplary embodiment, focusing mainly on differences with the previous exemplary embodiments.

Referring to FIG. 13, a pad portion 510 may include a first sub-pad unit 510a, a second sub-pad unit 510b, and a third sub-pad unit 510c. The first sub-pad unit 510a, the second sub-pad unit 510b, and the third sub-pad unit 510c may be arranged in a second direction Y. Each of the first sub-pad unit 510a, the second sub-pad unit 510b, and the third sub-pad unit 510c may include a plurality of pads P. The pad portion 510 includes a plurality of sub-pad units available for application to a driving integrated circuit and, therefore, may improve the efficiency of mounting a driving integrated circuit, regardless of the expansion or contraction of an array substrate.

The pads P, unlike the pads of FIGS. 10 to 12, may be formed as parallelograms. A data integrated circuit IC may include a plurality of bumps B corresponding to the pads P, respectively. The bumps B, like the pads P, may be formed as parallelograms. The bumps B may be formed to have shorter long sides than the pads P. That is, the bumps B may be moved in the second direction Y without being deviated from their respective pads P in the first, second, or third sub-pad unit 510a, 510b or 510c. That is, the pad portion 510 may further improve the efficiency of mounting a driving integrated circuit.

Figure 14:
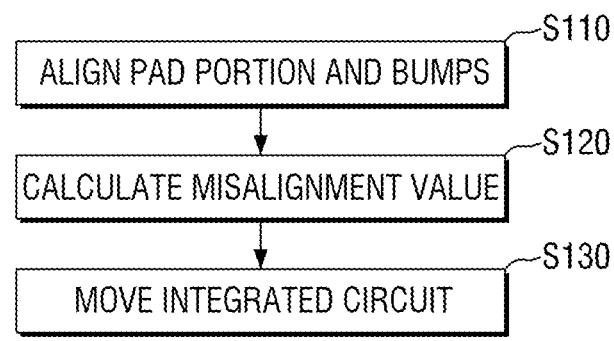
FIG. 14 is a flowchart illustrating a method of mounting an integrated circuit, according to an exemplary embodiment.

FIG. 14 is a flowchart illustrating a method of mounting an integrated circuit, according to an exemplary embodiment of the invention. The method will hereinafter be described with reference to FIGS. 1 to 14.

Referring to FIG. 14, the method includes aligning pads and bumps (step S110), calculating a misalignment value, which indicates the degree of misalignment between the pads and the bumps (step S120), and moving an integrated circuit (step S130).

More specifically, as illustrated in FIGS. 1 to 14, pads of a pad portion 110 and bumps B of a data driving integrated circuit IC are aligned (step S110).

An array substrate 100 and the data driving integrated circuit IC may be prepared in advance, and a description of the preparation of the array substrate 100 and the integrated circuit will, therefore, be omitted.

The array substrate 100 may include a display area DA displaying an image and a non-display area NA surrounding the display area DA. The pad portion 110 may be provided in the non-display area NA, may receive signals from the data driving integrated circuit IC, and may provide the signals to the display area DA. That is, the pad portion 110 may be a region where the data driving integrated circuit IC is mounted. The data driving integrated circuit IC may be COG-mounted on the pad portion 110. That is, the pad portion 110 may be a COG pad unit. Alternatively, in response to the array substrate 100 being formed of a flexible material, the pad portion 110 may be a COP pad unit.

The pad portion 110 may include a plurality of pads, and the driving integrated circuit IC may include a plurality of bumps B corresponding to the pads, respectively. The pads may be connected to the bumps B in a one-on-one arrangement. At least one alignment mark may be provided on one or both sides of each of the pad portion 110, and the data driving integrated circuit IC, and the data driving integrated circuit IC may be aligned with the pad portion 110 by aligning the alignment marks of the pad portion 110 and the data driving integrated circuit IC with each other.

The misalignment value is then calculated (S120).

The array substrate 100 where the pad portion 110 is provided may expand or contract during the preparation of the array substrate 100. The expansion or contraction of the array substrate 100 may affect the arrangement of the pads in the pad portion 110. That is, as a result of the expansion or contraction of the array substrate 100, the pads of the pad portion 110 may be misaligned with the bumps B, respectively, of the data driving integrated circuit IC, even if the alignment marks of the pad portion 110 and the data driving integrated circuit IC are still aligned with each other. The misalignment value, which indicates the degree of misalignment between the pads of the pad portion 110 and the bumps B of the data driving integrated circuit IC, may be calculated by scanning In one example, a solid-state imaging device may be used to capture an image of the state of alignment between the pads of the pad portion 110 and the bumps B of the data driving integrated circuit IC, and a distance b by which the pads of the pad portion 110 and the bumps B of the data driving integrated circuit IC are misaligned with each other, i.e., the misalignment value, may be calculated based on the captured image. The misalignment value b may a length in a first direction X by which the bumps B of the data driving integrated circuit IC are deviated from their respective pads of the pad portion 110 due to the expansion or contraction of the array substrate 100 in the first direction.

The calculation of the misalignment value b may include analyzing the misalignment value b. That is, in response to the misalignment value b being less than a predetermined threshold, the pads of the pad portion 110 and the bumps B of the data driving integrated circuit IC may be coupled together without proceeding to step S130. In response to the misalignment value b being greater than the predetermined threshold, a predetermined correction process for the misalignment between the pad portion 110 and the data driving integrated circuit IC is needed, and the method proceeds to step S130.

The data driving integrated circuit IC is moved (step S130).

The pad portion 110 may include one or more first pads P1, which are formed as parallelograms. For example, the first pads P1 may be formed as parallelograms having a first inclination angle θ1. The method has been described, taking the pad portion 110 of FIGS. 1 to 7 as an example, but is also applicable to the pad portion 210 of FIG. 8 and the pad portion 310 of FIG. 9. The pad portion 110 has already been described above with reference to FIGS. 1 to 7, and thus, a detailed description thereof will be omitted.

The bumps B of the data driving integrated circuit IC may also be formed as parallelograms having the same inclination angle as the first pads of the pad portion 110. The first pads of the pad portion 110 may be formed to have longer sides than the bumps B of the data driving integrated circuit IC to ensure the movement of the data driving integrated circuit IC in a second direction Y.

The data driving integrated circuit IC may be moved to correct its misalignment with the pad portion 110. That is, the data driving integrated circuit IC may be moved to a position that does not necessarily coincide with a position indicated by the alignment mark(s) thereof. The data driving integrated circuit IC may be moved in the second direction Y, which intersects the first direction X. A distance a by which the data driving integrated circuit IC is to be moved to correct the misalignment between the data driving integrated circuit IC and the pad portion 110 may be calculated by using Equation (1) above, i.e., by multiplying the misalignment value b by the tangent of the first inclination angle θ1 of the first pads of the pad portion 110.

According to this exemplary embodiment, because the first pads of the pad portion 110 are formed as parallelograms, the misalignment between the pads of the pad portion 110 and the bumps B of the data driving integrated circuit IC may be easily corrected simply by moving the data driving integrated circuit IC in the second direction Y. Accordingly, it is possible to facilitate aligning or realigning the pad portion 110 and the data driving integrated circuit with each other and, thus, to improve the efficiency of mounting an integrated circuit.

In an example, the movement of the data driving integrated circuit IC (S130) may include moving the data driving integrated circuit IC from one sub-pad unit to another sub-pad unit of a pad portion. In this example, the pad portion 410 of FIGS. 10 to 12 or the pad portion 510 of FIG. 13 may be used. More specifically, as illustrated in FIGS. 10 to 12, the pad portion 410 may include a first sub-pad unit 410*a*, a second sub-pad unit 410*b*, and a third sub-pad unit 410*c*. The first sub-pad unit 410*a*, the second sub-pad unit 410*b*, and the third sub-pad unit 410*c* may differ from one another in terms of the distance between an end thereof and an imaginary line CL that divides the pad portion 410 in half. The arrangement of pads in the second sub-pad unit 410*b* may correspond to the arrangement of the bumps B of the data driving integrated circuit IC, but the arrangement of pads in the first or third sub-pad unit 410*a* or 410*c* may differ from the arrangement of the bumps B of the data driving integrated circuit IC. That is, the first sub-pad unit 410*a* and the third sub-pad unit 410*c* may be reserved for application to a contracted or expanded array substrate. That is, the movement of the data driving integrated circuit IC (S130) may include moving the data driving integrated circuit IC from the second sub-pad unit 410*b* to the first or third sub-pad unit 410*a* or 410*c* according to the misalignment value b. In response to the data driving integrated circuit IC being corrected for its misalignment with the pad portion 110, 210, 310, 410, or 510, the data driving integrated circuit IC may be coupled to the pad portion 110, 210, 310, 410, or 510 via an ACF.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. An array substrate, comprising:
 a display area; and
 a non-display area surrounding the display area, wherein:
 the non-display area comprises:
  a pad portion comprising a first sub-pad unit comprising a first pad that has a parallelogram shape; and
  a second sub-pad unit comprising a second pad that has a parallelogram shape; and
 the first pad and the second pad are symmetrically arranged with respect to an imaginary line that divides the pad portion in half.

2. The array substrate of claim 1, wherein the first pad has a first short side extending in a first direction, a second short side parallel to the first short side, a first long side extending diagonally from one end of the first short side at a first inclination angle, and a second long side parallel to the first long side.

3. The array substrate of claim 1, wherein the pad portion further comprises a third sub-pad unit comprising a third pad that has a rectangular shape and is disposed in the middle of the pad portion.

4. The array substrate of claim 1, wherein an inclination angle of the first pad increases as the first pads get closer to the imaginary line, the inclination angle being an acute internal angle between the short sides and the long sides of the first pad.

5. The array substrate of claim 1, wherein the pad portion further comprises a first sub-pad portion on which a data driving integrated circuit is disposed and a second sub-pad portion on which a flexible printed circuit board (FPCB) is disposed, and each of the first sub-pad portion and the second sub-pad portion comprises the first pad.

6. The array substrate of claim 5, wherein each of the data driving integrated circuit and the FPCB comprises bumps disposed in a pattern corresponding to a pattern of the first pad, the long sides of the first pad being longer than the long sides of the bumps.

7. An array substrate, comprising:
 a display area; and
 a non-display area surrounding the display area, wherein:

the non-display area comprises a pad portion comprising a first sub-pad unit and a second sub-pad unit, arranged in parallel with each other; and ends of the first sub-pad unit and the second sub-pad unit are disposed at different distances from an imaginary line that divides the pad portion in half.

8. The array substrate of claim 7, wherein each of the first sub-pad unit and the second sub-pad unit comprises a plurality of pads arranged in a first direction.

9. The array substrate of claim 8, wherein the pads are symmetrically arranged in with respect to the imaginary line.

10. The array substrate of claim 8, wherein the pads have rectangular shapes.

11. The array substrate of claim 8, wherein the pads have parallelogram shapes.

12. The array substrate of claim 11, wherein the pads have different inclination angles from one another, and inclination angles of the pads increase as the pads get closer to the imaginary line, the inclination angles being an acute internal angle between the short sides and the long sides of the pads.

13. The array substrate of claim 11, wherein the first sub-pad unit and the second sub-pad unit are arranged in a second direction that is perpendicular to the first direction.

* * * * *